(12) United States Patent
Radhakrishnan et al.

(10) Patent No.: US 7,463,492 B2
(45) Date of Patent: *Dec. 9, 2008

(54) ARRAY CAPACITORS WITH VOIDS TO ENABLE A FULL-GRID SOCKET

(75) Inventors: Kaladhar Radhakrishnan, Chandler, AZ (US); Dustin P. Wood, Chandler, AZ (US); Nicholas L. Holmberg, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/823,522

(22) Filed: Jun. 26, 2007

(65) Prior Publication Data

US 2007/0253142 A1 Nov. 1, 2007

Related U.S. Application Data

(63) Continuation of application No. 10/747,965, filed on Dec. 29, 2003, now Pat. No. 7,265,995.

(51) Int. Cl.
*H05K 7/00* (2006.01)
(52) U.S. Cl. .................................. 361/782; 361/306.2
(58) Field of Classification Search ................. 361/302, 361/306.2, 306.3, 307, 734, 738, 780, 782, 361/783, 794
See application file for complete search history.

(56) References Cited

U.S. PATENT DOCUMENTS

| | | | | |
|---|---|---|---|---|
| 3,519,959 A | * | 7/1970 | Bewley et al. | .................. 333/1 |
| 3,880,493 A | | 4/1975 | Lockhart, Jr. | |
| 4,626,958 A | | 12/1986 | Lockard et al. | |
| 4,916,576 A | | 4/1990 | Herbert et al. | |
| 5,095,626 A | * | 3/1992 | Kitamura et al. | .............. 29/827 |
| 5,177,663 A | | 1/1993 | Ingleson et al. | |
| RE35,064 E | * | 10/1995 | Hernandez | .................. 361/763 |

(Continued)

OTHER PUBLICATIONS

PCT Notification of Transmittal of the International Search Report dated Jun. 22, 2005, PCT/US2004/04339, filed Dec. 23, 2004.

*Primary Examiner*—Jeremy C. Norris
*Assistant Examiner*—Yuriy Semenenko
(74) *Attorney, Agent, or Firm*—Blakely, Sokoloff, Taylor & Zafman LLP (57) ABSTRACT

An array capacitor is described for use with an integrated circuit (IC) mounted on an IC package. The array capacitor includes a number of first conductive layers interleaved with a number of second conductive layers and a number of dielectric layers separating adjacent conductive layers. The array capacitor further includes a number of first conductive vias to electrically connect the first conductive layers and a number of second conductive vias to electrically connect the second conductive layers. The array capacitor is provided with openings which are configured to enable pins from an IC package to pass through.

18 Claims, 5 Drawing Sheets

U.S. PATENT DOCUMENTS

| | | | |
|---|---|---|---|
| 5,621,245 A * | 4/1997 | Agatstein et al. | 257/723 |
| 5,625,228 A * | 4/1997 | Rogren | 257/712 |
| 5,946,470 A | 8/1999 | Neal et al. | |
| 6,191,479 B1 | 2/2001 | Herrell et al. | |
| 6,678,145 B2 | 1/2004 | Naito et al. | |
| 6,831,529 B1 | 12/2004 | Devoe et al. | |
| 7,023,685 B2 * | 4/2006 | Fujiyama et al. | 361/306.1 |
| 7,265,995 B2 * | 9/2007 | Radhakrishnan et al. | 361/782 |
| 2002/0017700 A1 | 2/2002 | Mori et al. | |
| 2003/0147226 A1 | 8/2003 | Devey | |
| 2004/0045161 A1 | 3/2004 | Larson | |

* cited by examiner

ARRAY CAPACITORS WITH VOIDS TO ENABLE A FULL-GRID SOCKET

CROSS-REFERENCE TO RELATED APPLICATIONS

This application is a continuation of U.S. patent application Ser. No. 10/747,965 filed Dec. 29, 2003 now U.S. Pat. No. 7,265,995, entitled, "Array Capacitors with Voids to Enable a Full-Grid Socket."

BACKGROUND OF THE INVENTION

1. Field

Embodiments of the invention relate to capacitors and integrated circuit (IC) package assembly, and more specifically, to array capacitors suitable for use with integrated circuits mounted on IC packages.

2. Description of the Related Art

Typically, in integrated circuit (IC) packages such as for mounting IC dies, among other integrated circuitry, a voltage regulator circuit is used to provide electrical power to the semiconductor die. One way of providing voltage regulation to an IC die or chip is mounting a voltage regulator module (VRM) on a printed circuit board (PCB), for example, of a computer system. However, the VRM by itself cannot meet all the power demands of high-speed microelectronic devices (e.g., high performance processors). Specifically, the VRM cannot respond immediately to sudden changes in the current drawn by the die which could generate unacceptably large reductions in voltage, often called voltage droops. This voltage drop on the die increases the switching time of the transistors on the die, which degrades the performance of the system fabricated on the die. To ameliorate excessive voltage droops, decoupling capacitors may be used to assist in preventing a drop in voltage levels in an IC die.

Discrete decoupling capacitors are typically mounted adjacent to the IC die and connected to the conductors that provide power to the die. For a processor die, the die may be mounted on a substrate (e.g., an IC package), and a number of discrete capacitors may be mounted on the substrate along the periphery of the die and/or underneath the die. These capacitors are coupled to the power supply connections at the die through lands formed on the substrate. The capacitors may be used to store energy for use by the die during periods of non-steady state or transient current demands, or to manage noise problems that occur in the die.

One concern associated with power decoupling is inductance in the path from the chip (IC die) to the capacitors. As the chips get faster, it is critical to keep this inductance small in order to manage the high frequency noise. In order to minimize the effective inductance in the path from the chip to the capacitors, the capacitors are typically placed on the backside of the package under the die shadow. In order to accommodate these capacitors, the sockets that are used in microprocessors today have a cavity in the center.

While the capacitors on the package take care of the high frequency noise, they do not have enough capacitance to address the low frequency noise. A significant contribution to the low frequency noise comes from the resistance in the path from the VRM to the chip. This is comprised of the motherboard (MB) resistance, the socket resistance and the package resistance.

BRIEF DESCRIPTION OF THE DRAWINGS

The invention is illustrated by way of example and not by way of limitation in the figures of the accompanying drawings in which like references indicate similar elements. It should be noted that the references to "an" or "one" embodiment of this disclosure are not necessarily to the same embodiment, and such references mean at least one.

DETAILED DESCRIPTION OF THE INVENTION

In the following description, specific details are set forth. However, it is understood that embodiments of the invention may be practiced without these specific details. In other instances, well-known circuits, structures and techniques have not been shown in detail to avoid obscuring the understanding of this description.

Figure 1:
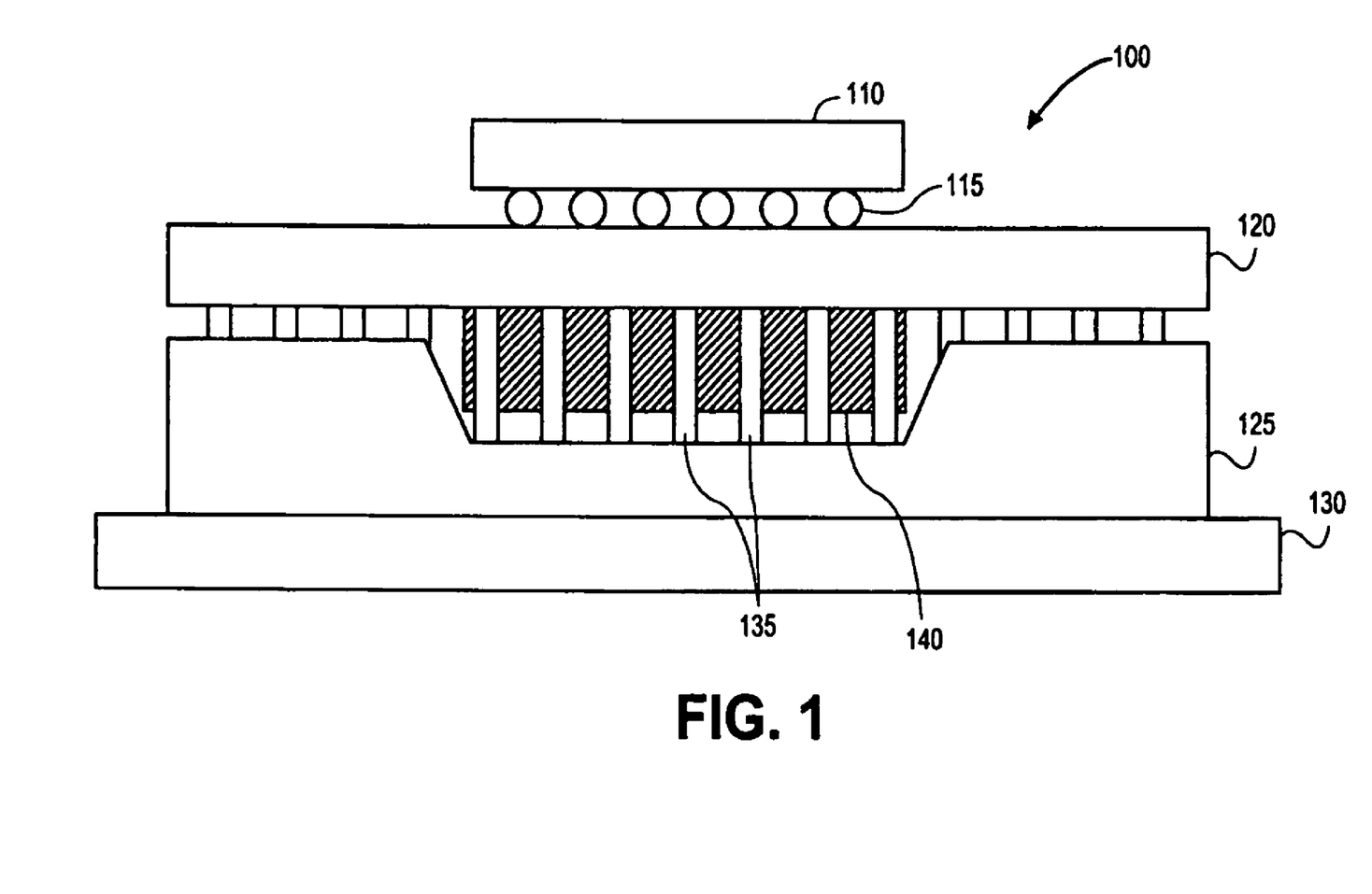
FIG. 1 shows a cross-sectional side elevational view of an array capacitor for a package assembly according to one embodiment.

FIG. 1 shows a cross-sectional side elevational view of an array capacitor for a package assembly according to one embodiment. The package assembly includes an integrated circuit (IC) 110, which is housed by IC package 120. The integrated circuit 110 may contain one or more circuits that are electrically connected to the package 120 by connectors 115. In one embodiment, the connectors 115 are bump (solder ball) type electrodes. These circuits may act as the intended load to which power is supplied by the VRM through the package. Although not shown herein, a voltage regulated power supply which may be provided in a VRM of a known type may be mounted on a printed circuit board (PCB) 130, such as a motherboard.

Integrated circuit 110 may be a high-speed processor, which may be employed in computers, servers or network systems or otherwise and may be other types of circuits. In one embodiment, the integrated circuit 110 may be a semiconductor die or may be representative of one or more IC chips or a combination of different types of circuits including high-performance dies or chips, although not limited thereto. In the illustrated embodiment, an IC die 110 is shown which has bumps 115 (e.g., solder balls) mounted on an upper surface of IC package 120. Alternatively, the integrated circuit 110 may be a surface mounted chip, in which input/output terminals thereof are connected to the IC package 120 using bond wires for connecting the chip to bonding pads at the upper surface of IC package 120. Although not shown herein, embedded capacitors may be incorporated within the integrated circuit 110 and/or the IC package 120, as deemed necessary.

Also included within the package assembly 100 is an array capacitor 140. In an embodiment, the array capacitor 140 is placed on the backside of the IC package 120 underneath the integrated circuit 110. IC package 120, in FIG. 1, is coupled to a socket 125, which is on the PCB 130. As shown in FIG. 1, the pins from the package, including pins passing through the array capacitor, are inserted into the socket. In one embodiment, the socket 125 is configured to receive power and ground pins extending from the backside of the package under the die shadow. The socket 125 is shaped to accommodate the array capacitor 140. In an embodiment, a portion of the socket 125 located underneath the integrated circuit 110 is recessed to make room for the array capacitor 140.

In one embodiment, the socket and package resistance is reduced by using a full-grid socket 125 with no cavity and adding power and ground pins 135 on the backside of the package under the die shadow. More specifically, because the power and ground pins 135 located directly underneath the integrated circuit (e.g., semiconductor die) 110 are allowed to pass through the array capacitor 140, this arrangement enables a low resistance path through the array capacitor.

Figure 2:
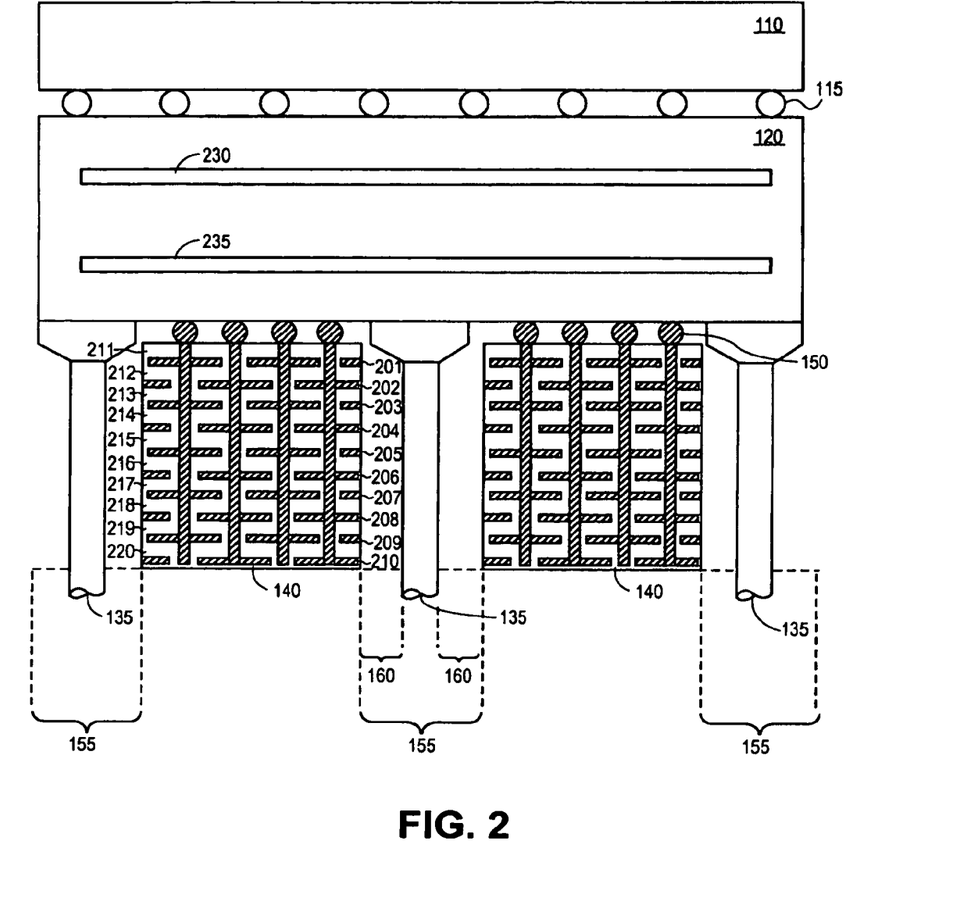
FIG. 2 shows an enlarged side elevation view of a portion of the package assembly 100 shown in FIG. 1.

FIG. 2 shows an enlarged side elevation view of a portion of the package assembly 100 shown in FIG. 1. A portion of an array capacitor 140 is illustrated in FIG. 2, which has voids or openings 155 to enable pins 135 from the IC package 120 to pass through. In an embodiment, the diameter of each void or opening 155 formed in the array capacitor 140 is slightly greater than the diameter of each pin 135 from the IC package 120 such that a defined distance 160 is maintained between the edge of the opening and the pin.

In the illustrated embodiment, the array capacitor includes a number of first conductive layers 201, 203, 205, 207 and 209 interleaved with a number of second conductive layers 202, 204, 206, 208 and 210. Dielectric layers 211 through 220 separate adjacent conductive layers. The first conductive layers 202, 204, 206, 208, and 210 are configured to be coupled to a first node in a circuit. In an embodiment, the first node is a ground plane 230 provided in the IC package 120. The second conductive layers 201, 203, 205, 207 and 209 are configured to be coupled to a second node in a circuit. In an embodiment, the second node is a power plane 235 provided in the IC package 120. The power plane 235 provides a positive potential to the second conductive layers. In an embodiment, the ground plane 230 and the power plane 235 are coupled to the integrated circuit 110 (e.g., semiconductor die) to provide electrical power and grounding to the circuits contained in the die.

In an embodiment, the array capacitor 140 is electrically coupled to the ground plane 230 and the power plane 235 in the package 120 via bumps 150 (e.g., solder balls) provided between the array capacitor 140 and the package 120. While the illustrated array capacitor 140 is shown with ten layers 201 through 210, it should be noted that the number of layers may be greater than ten in an embodiment. In another embodiment, the number of layers is less than ten. Capacitance may be determined by the surface area of the plates and the distance between the plates, generally the greater the surface area, smaller the distance between the plates and/or greater the dielectric constant, the greater the capacitance.

Figure 3:
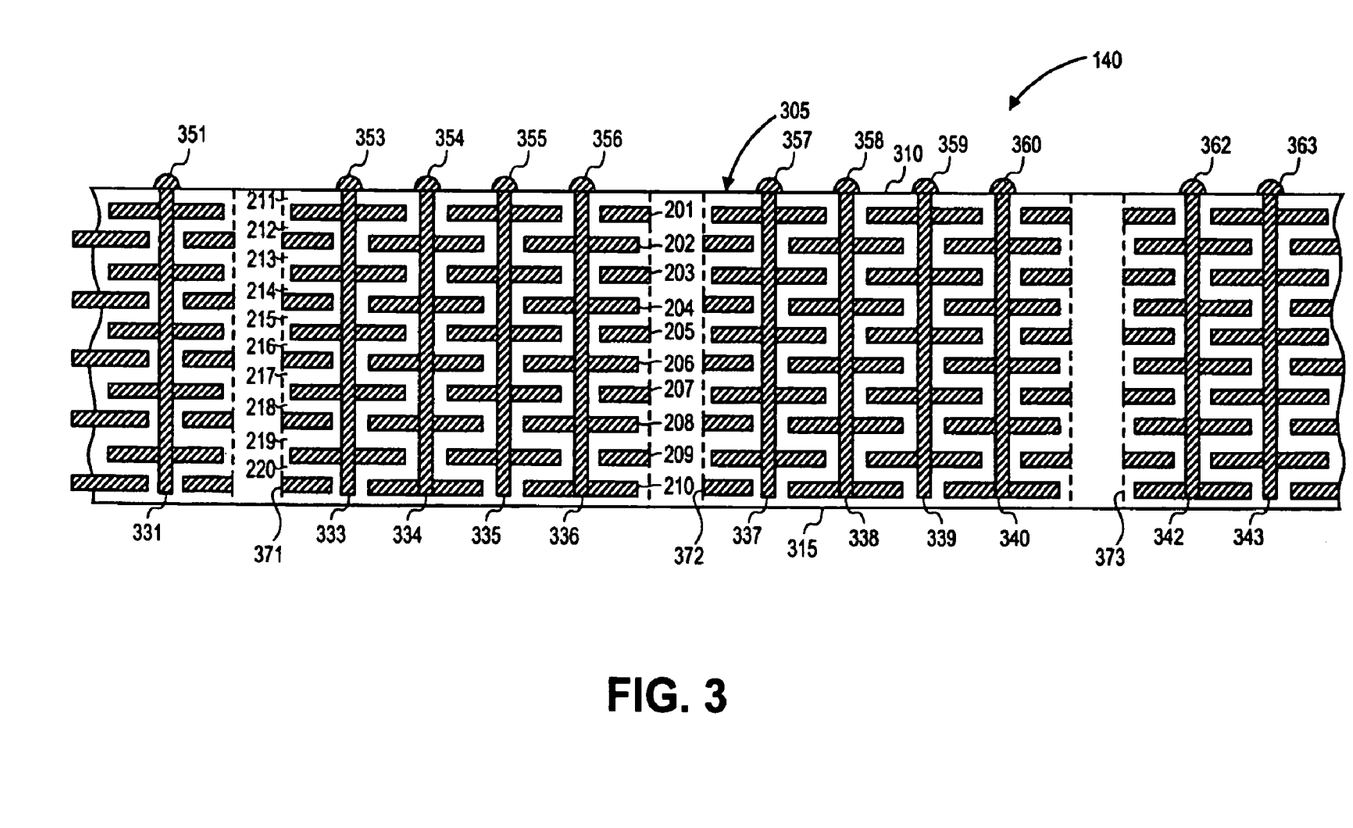
FIG. 3 shows a cross-sectional side elevational view of a portion of an array capacitor according to one embodiment.

FIG. 3 shows a cross-sectional side elevational view of a portion of an array capacitor according to one embodiment. The array capacitor 140 includes a main body 305 having a top surface 310 and a bottom surface 315. In an embodiment, the top surface 310 and the bottom surface 315 have a substantially square and rectangular shape. It should be noted that other shapes such as circular or oval may be used with the capacitors described herein.

The array capacitor 140 includes a number of first conductive vias 331, 333, 335, 337, 339, 343 to electrically connect the first conductive layers 201, 203, 205, 207, 209 and a number of second conductive vias 334, 336, 338, 340, 342 to electrically connect the second conductive layers 202, 204, 206, 208, 210. In an embodiment, the first conductive vias 331, 333, 335, 337, 339, 343 are used to electrically connect the first conductive layers 201, 203, 205, 207, 209 to a ground plane in the IC package via first conductive terminals (e.g., solder balls) 351, 353, 355, 357, 359, 353, respectively. In an embodiment, the second conductive vias 334, 336, 338, 340, 342 are used to electrically connect the second conductive layers 202, 204, 206, 208, 210 to a power plane in the IC package via first conductive terminals (e.g., solder balls) 354, 356, 358, 360, 362, respectively. The array capacitor 140 further includes a number of openings 371, 372, 373 that extend vertically between the top surface 310 and the bottom surface 315 of the main body 305. The openings 371, 372, 373 are sized and shaped to enable pins from an IC package to pass through.

Figure 4:
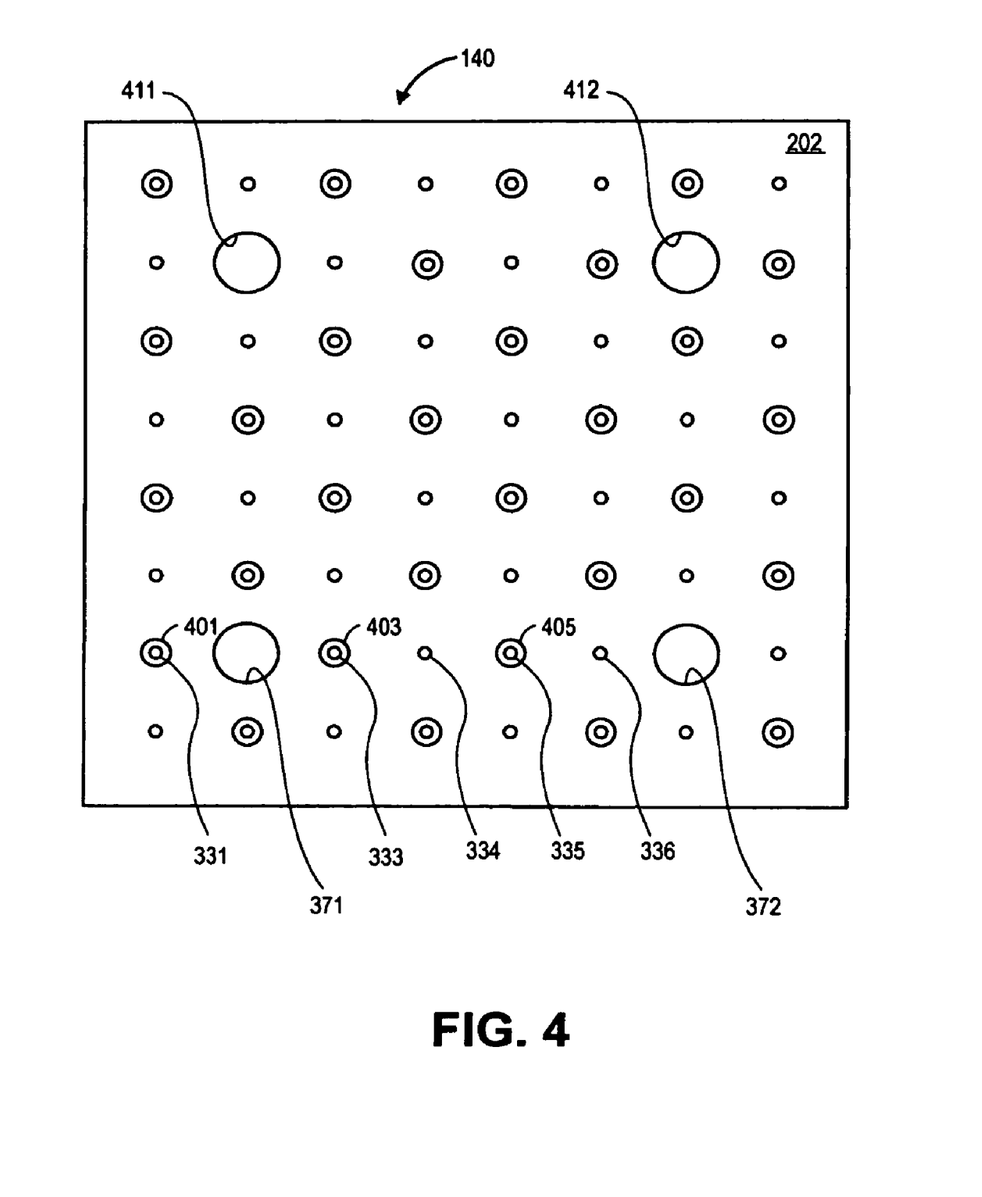
FIG. 4 shows a top plan view of an internal structure of an array capacitor according to one embodiment.

FIG. 4 shows a plan view of an array capacitor according to one embodiment. Specifically, FIG. 4 shows a section surface on which a second conductive layer 202 is disposed. The first conductive vias 331, 333, 335 pass through the second conductive layer 202, which form gaps 401, 403, 405 around the part where the first conductive vias 331, 333, 335 pass through. In an embodiment, the first conductive vias 331, 333, 335 are insulated from the second conductive layer 202. The second conductive layer 202 is connected to other second conductive layers by the second conductive vias 334, 336.

Also illustrated in FIG. 4 are a number of pin-insertable openings 371, 372, 411, 412 formed in the array capacitor 140. In an embodiment, the number of and the spacing between the pin-insertable openings are selected to accommodate pins from the package extending from the location of the array capacitor. The illustrated array capacitor is shown with four pin-insertable openings. However, it should be noted that the number of pin-insertable openings may be greater than four in an embodiment. In another embodiment, the number of openings is less than four.

Figure 5:
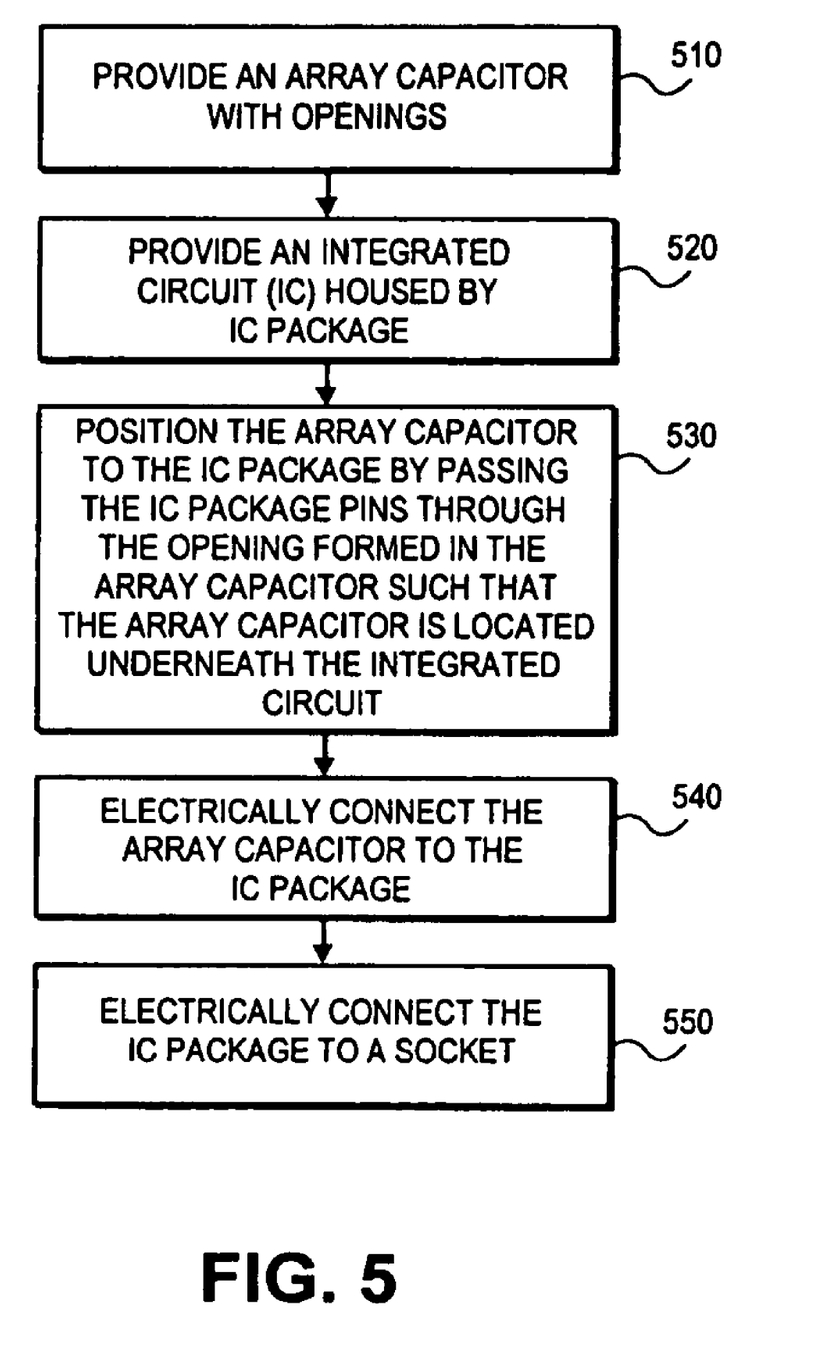
FIG. 5 shows a flowchart diagram illustrating a process of incorporating an array capacitor into an integrated circuit package according to one embodiment.

FIG. 5 shows a process of incorporating an array capacitor into an integrated circuit package according to one embodiment. In block 510, an array capacitor with voids is provided. This may be done by fabricating a complete array capacitor and then forming voids or holes in the array capacitor during the fabrication of the array capacitor. The voids or holes formed in the array capacitor are arranged to coincide with the pins extending from the IC package. Then in block 520, an integrated circuit housed by an IC package is provided. The array capacitor is positioned with respect to the IC package by passing the IC package pins through the openings formed in the array capacitor such that the array capacitor is located directly underneath the integrated circuit mounted on the IC package (block 530). Then, the array capacitor is electrically connected to the IC package by using the conductive terminals provided on the array capacitor to couple with the ground plane and power plane provided in the IC package (block 540). Then in block 550, the IC package and the array capacitor is connected to a socket on a printed circuit board.

It should be noted that because embodiments of the capacitors described herein are capable of being mounted underneath an IC package and has openings to enable pins extending downward from the IC package to pass through, the package resistance can be reduced without sacrificing the package decoupling performance. In one embodiment, the capacitor described herein is used to satisfy high frequency noise and low frequency noise requirements of high-performance processors.

While several embodiments have been described, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A capacitor structure comprising:
a plurality of first conductive layers;
a plurality of second conductive layers interleaved with the first conductive layers;
a plurality of dielectric layers separating adjacent conductive layers;
a plurality of first conductive vias to electrically connect the first conductive layers;
a plurality of second conductive vias to electrically connect the second conductive layers;
wherein openings are formed in the capacitor structure to enable pins from an integrated circuit package to pass through the opening, and wherein the openings are arranged to coincide with pins from the integrated circuit package that are located underneath a semiconductor die.

2. A capacitor structure comprising:
a plurality of first conductive layers;
a plurality of second conductive layers interleaved with the first conductive layers;
a plurality of dielectric layers separating adjacent conductive layers;
a plurality of first conductive vias to electrically connect the first conductive layers;
a plurality of second conductive vias to electrically connect the second conductive layers;
wherein openings are formed in the capacitor structure to enable pins from an integrated circuit package to pass through the opening, and wherein a defined distance is maintained between an edge of each respective opening and each respective pin.

3. The capacitor structure of claim 2, wherein each of the openings has a diameter which is greater than a diameter of each pin from the integrated circuit package.

4. The capacitor structure of claim 1, further comprising:
a plurality of first conductive terminals coupled to the plurality of first conductive vias; and
a plurality of second conductive terminals coupled to the plurality of second conductive vias.

5. The capacitor structure of claim 4, wherein:
the first conductive terminals are configured for coupling to a ground plane provided in an IC package; and
the second conductive terminals are configured for coupling to a power plane provided in the IC package.

6. A system comprising:
an integrated circuit (IC) coupled to a first side of an IC package; and
an array capacitor attached to a second side of the IC package underneath the integrated circuit, the capacitor having openings to enable pins from the IC package to pass through and beyond the openings, wherein the openings are arranged to coincide with pins from the IC package that are located directly underneath the integrated circuit.

7. The system of claim 6 wherein the array of capacitors is an array capacitor comprising:
a plurality of first conductive layers;
a plurality of second conductive layers interleaved with the first conductive layers;
wherein the plurality of first conductive layers are coupled to a ground plane in the IC package and the plurality of second conductive layers are coupled to a power plane in the IC package.

8. A system comprising:
an integrated circuit (IC) coupled to a first side of an IC package;
an array capacitor attached to a second side of the IC package underneath the integrated circuit;
openings formed in the capacitor having a diameter which is greater than a diameter of pins disposed in the openings from the integrated circuit package such that a defined distance is maintained between an edge of each respective opening and each respective pin; and
a socket to receive the pins from the IC package.

9. A system comprising:
an integrated circuit (IC) coupled to a first side of an IC package;
an array of capacitors attached to a second side of the IC package underneath the integrated circuit;
openings formed in the capacitor having a diameter which is greater than a diameter of pins disposed in the openings from the integrated circuit package such that a defined distance is maintained between an edge of each respective opening and each respective pin, wherein the capacitor comprises:
a plurality of first conductive layers coupled to a first node in the integrated circuit;
a plurality of second conductive layers interleaved with the first conductive layers, the second conductive layers coupled to a second node in the integrated circuit; and
a plurality of dielectric layers separating adjacent conductive layers.

10. The system of claim 9, wherein the capacitor further comprises:
a plurality of first conductive vias to electrically connect the first conductive layers;
a plurality of second conductive vias to electrically connect the second conductive layers;
a plurality of first conductive terminals coupled to the plurality of first conductive vias; and
a plurality of second conductive terminals coupled to the plurality of second conductive vias.

11. The system of claim 8, wherein the socket is a full-grid socket that is capable of receiving power and ground pins located on a backside of the package under a die shadow.

12. The system of claim 8, wherein the socket is shaped to accommodate the capacitor attached to the IC package.

13. The system of claim 8, wherein the integrated circuit is embodied in a form of a semiconductor die.

14. A method comprising:
providing an array capacitor with a plurality of openings;
providing an integrated circuit (IC) housed by an IC package;
passing pins from the IC package through and beyond the openings formed in the capacitor;
positioning the capacitor on a backside of the IC package underneath the integrated circuit; and
electrically connecting the IC package to a socket.

15. A method comprising:
providing an array capacitor with a plurality of openings;
providing an integrated circuit (IC) housed by an IC package;
passing pins from the IC package through and beyond the openings formed in the capacitor;
positioning the capacitor on a backside of the IC package underneath the integrated circuit, wherein the capacitor is an array capacitor comprising:
a plurality of first conductive layers;
a plurality of second conductive layers interleaved with the first conductive layers; and
a plurality of dielectric layers separating adjacent conductive layers.

16. The method of claim 14, further comprising:
maintaining a defined distance between an edge of each respective opening and each respective pin 17. The method of claim 14, further comprising:
electrically connecting and attaching conductive terminal between the capacitor and the IC package.

18. The method of claim 17, wherein electrically connecting the capacitor to the IC package comprises:
electrically coupling the first conductive layers to a first node in the integrated circuit;
electrically coupling the second conductive layers to a second node in the integrated circuit; and
positioning the capacitor on a backside of the IC package directly underneath the integrated circuit.

* * * * *

UNITED STATES PATENT AND TRADEMARK OFFICE
CERTIFICATE OF CORRECTION

PATENT NO.        : 7,463,492 B2
APPLICATION NO.   : 11/823522
DATED             : December 9, 2008
INVENTOR(S)       : Radhakrishnan et al.

Page 1 of 1

It is certified that error appears in the above-identified patent and that said Letters Patent is hereby corrected as shown below:

In column 5, at line 49 delete, "capacitor" and insert --of capacitors--.

Signed and Sealed this

Twenty-second Day of December, 2009

David J. Kappos
*Director of the United States Patent and Trademark Office*